United States Patent
Sedlak

[11] Patent Number: 5,999,035
[45] Date of Patent: Dec. 7, 1999

[54] METHOD FOR DRIVING A FIELD-EFFECT TRANSISTOR

[75] Inventor: Holger Sedlak, München, Germany

[73] Assignee: Siemens Aktiengesellschaft, Munich, Germany

[21] Appl. No.: 08/907,212

[22] Filed: Aug. 6, 1997

Related U.S. Application Data

[63] Continuation of application No. PCT/DE96/02236, Nov. 21, 1996.

[30] Foreign Application Priority Data

Dec. 6, 1995 [DE] Germany ............................ 195 45 558

[51] Int. Cl.[6] .................................................. H03K 17/74
[52] U.S. Cl. .......................... 327/420; 327/427; 327/434; 365/185.01; 365/182
[58] Field of Search .................................... 327/424, 427, 327/434, 199, 94, 91, 420; 365/185.01, 182

[56] References Cited

U.S. PATENT DOCUMENTS

| | | | |
|---|---|---|---|
| 4,281,399 | 7/1981 | Yamamoto | 365/203 |
| 5,220,528 | 6/1993 | Mielke | 365/185 |
| 5,241,502 | 8/1993 | Lee et al. | 365/203 |

FOREIGN PATENT DOCUMENTS 0 472 095 A2  2/1992  European Pat. Off. .

OTHER PUBLICATIONS

"Novel High Voltage Silicon–On–Insulator MOSFETs" (Ratnam et al.), Solid State Electronics, vol. 35, No. 12, pp. 1745–1750, May 1992.

*Primary Examiner*—Kenneth B. Wells
*Assistant Examiner*—Minh Nguyen
*Attorney, Agent, or Firm*—Herbert L. Lerner; Laurence A. Greenberg

[57] ABSTRACT

A method for driving a field-effect transistor having a source section, a drain section and a gate section, includes applying a gate voltage to the gate section and causing the formation and/or maintenance of an electrically conductive channel between the source section and the drain section. After the channel has been formed, the gate section is disconnected from a gate voltage supply source which applies the gate voltage to the gate section.

11 Claims, 2 Drawing Sheets

METHOD FOR DRIVING A FIELD-EFFECT TRANSISTOR

CROSS-REFERENCE TO RELATED APPLICATION

This application is a continuation of International Application Ser. No. PCT/DE96/02236, filed Nov. 21, 1996.

BACKGROUND OF THE INVENTION

Field of the Invention

The present invention relates to a method for driving a field-effect transistor having a source section, a drain section and a gate section, which includes applying a gate voltage to the gate section and causing the formation and/or maintenance of an electrically conductive channel between the source section and the drain section.

Such field-effect transistors (FETS) and methods for driving them have been known for a long time. FIG. 4 shows a practical embodiment of such a transistor which is described below.

In the case of conventional field-effect transistors in steady-state operation, it is not possible to pass a voltage applied to the source or drain section through a gate voltage which is of equal magnitude or is lower. In fact, for that purpose the gate voltage must be changed to a level which is above the voltage to be passed through by an amount at least equal to a material-dependent threshold voltage for channel formation.

Particularly in digital technology, where field-effect transistors of the enhancement type are predominantly used, that is linked with not inconsiderable difficulties when it is intended to switch voltage levels which are above the supply voltage. The production of an additional voltage level for use as the gate voltage has until now been carried out through the use of so-called pumps, which raise a voltage at a low level (in steps if necessary) to a voltage at a higher level. The circuitry implementation of such pumps necessitates a multiplicity of additional electronic components (in particular transistors and capacitors), which is disadvantageous, above all in the case of integrated circuits (it is area-intensive and high and low voltage surfaces are difficult to isolate).

SUMMARY OF THE INVENTION

It is accordingly an object of the invention to provide a method for driving a field-effect transistor, which overcomes the hereinafore-mentioned disadvantages of the heretofore-known methods of this general type in such a manner that it becomes possible to pass high voltages through in a simple manner, using gate voltages that are of equal magnitude or are lower.

With the foregoing and other objects in view there is provided, in accordance with the invention, a method for driving a field-effect transistor having a source section, a drain section and a gate section, which comprises applying a gate voltage to the gate section and causing at least one of formation and maintenance of an electrically conductive channel between the source section and the drain section; and after the channel has been formed, disconnecting the gate section from a gate voltage supply source applying the gate voltage to the gate section.

The provision of this measure makes it possible to raise the gate potential (which is now floating or is no longer actively driven) through the use of a voltage (to be passed through), that is applied after disconnection of the gate section from the gate voltage supply source, to a potential which is greater than the potential of the voltage to be passed through, so that without complex generation of a separate gate voltage, it is also possible to switch voltages that cannot be passed through in the case of conventional field-effect transistor drives because the condition $$U_G > \min(U_S, U_D) + U_T$$

is not satisfied, wherein $U_G$ is the gate voltage, $U_S$ is the source voltage, $U_D$ is the drain voltage and $U_T$ is a material-dependent threshold voltage for channel formation having a value $U_T > 0$ V for NMOS FETs.

In this way, a method for driving field-effect transistors has been provided which makes it possible, in a simple manner, to pass through high voltages using gate voltages that are of the same magnitude or are lower.

In accordance with another mode of the invention, there is provided a method which comprises disconnecting the gate section from the gate voltage supply source immediately after the channel has been formed or within a relative short time thereafter.

In accordance with a further mode of the invention, there is provided a method which comprises keeping the gate potential essentially unchanged during the disconnection of the gate section from the gate voltage supply source.

In accordance with an added mode of the invention, there is provided a method which comprises placing the gate section in an essentially floating state after the disconnection of the gate section from the gate voltage supply source.

In accordance with an additional mode of the invention, there is provided a method which comprises disconnecting the gate section from the gate voltage supply source with a switching device interrupting an electrical connection between the gate section and the gate voltage supply source.

In accordance with yet another mode of the invention, there is provided a method which comprises causing a source voltage and a drain voltage to assume values which cause at least one of the formation and maintenance of the electrically conductive channel by interaction with the gate voltage, until the disconnection of the gate section from the gate voltage supply source.

In accordance with yet a further mode of the invention, there is provided a method which comprises, after the disconnection of the gate section from the gate voltage supply source, causing a source voltage to assume values desired to pass through to the drain section, and possibly causing the source voltage to simultaneously assume values which would prevent the formation of the channel or would cause it to break down if provided before the disconnection of the gate section from the gate voltage supply source.

In accordance with yet an added mode of the invention, there is provided a method which comprises starting the changes to the source voltage immediately after the disconnection of the gate section from the gate voltage supply source or within a relatively short time thereafter In accordance with yet an additional mode of the invention, there is provided a method which comprises gradually carrying out the changes to the source voltage.

In accordance with again another mode of the invention, there is provided a method which comprises increasing the source voltage in steps.

In accordance with a concomitant mode of the invention, there is provided a method which comprises continuously increasing the source voltage.

The drive method according to the invention can furthermore also advantageously be used in a not insignificant multiplicity of further applications as a result of the behavior of the driven field effect transistor which results therefrom.

Other features which are considered as characteristic for the invention are set forth in the appended claims.

Although the invention is illustrated and described herein as constructed in a method for driving a field-effect transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 4:
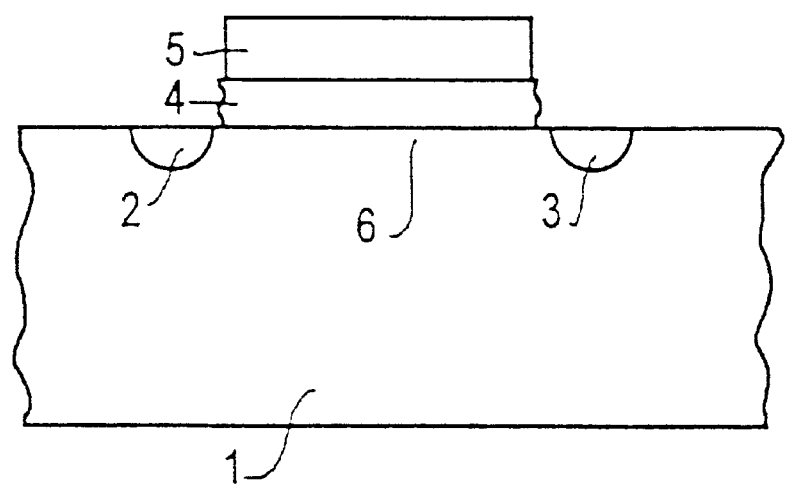
FIG. 4 is a fragmentary, cross-sectional view of a conventional field-effect transistor.

Referring now to the figures of the drawings in detail and first, particularly, to FIG. 4 thereof, there is seen a diagrammatic illustration of a conventional enhancement-type NMOS-FET. The illustrated transistor includes a substrate 1 formed from p-doped semiconductor material, a source section 2 provided on a surface of the substrate and formed from n-doped semiconductor material, a drain section 3 provided on the substrate surface and formed from n-doped semiconductor material, an insulation layer 4 applied on the substrate, and a gate section 5 provided above the insulation layer.

If a positive voltage, for example +5 V, is applied to the gate section 5, then electrons are drawn to a region of the substrate opposite the gate section, namely a channel formation region 6, from substrate regions further away from the gate section. The channel formation region 6, which initially has a shortage of electrons due to the p-doping and therefore is not electrically conductive, consequently gradually becomes a region which has excess electrons and finally forms an electrically conductive channel between the source section 2 and the drain section 3. The formation of such a channel causes the transistor to switch on, that is to say it causes a low-resistance electrical connection from the source section to the drain section.

However, the formation and maintenance of the described channel takes place only when and as long as the gate voltage ($U_G$) is at a certain minimum value which depends, inter alia, on the source voltage ($U_S$) applied to the source section and on the drain voltage ($U_D$) applied to the drain section. Thus, when the transistor is in steady-state operation, then, in principle, the condition $$U_G > \min(U_S, U_D) + U_T$$

must be satisfied when it is intended for the transistor to reach or maintain the switched-on stage, wherein $U_T$ represents a material-dependent threshold voltage for channel formation and has a value of $U_T > 0$ V in the case of field-effect transistors of the NMOS enhancement type.

In consequence, in the case of conventional field-effect transistors in steady-state operation, it is not possible to pass a voltage applied to the source or drain section through a gate voltage which is of equal magnitude or is lower. In fact, for this purpose the gate voltage must be changed to a level which is at least $U_T$ above the voltage to be passed through.

Figure 1:
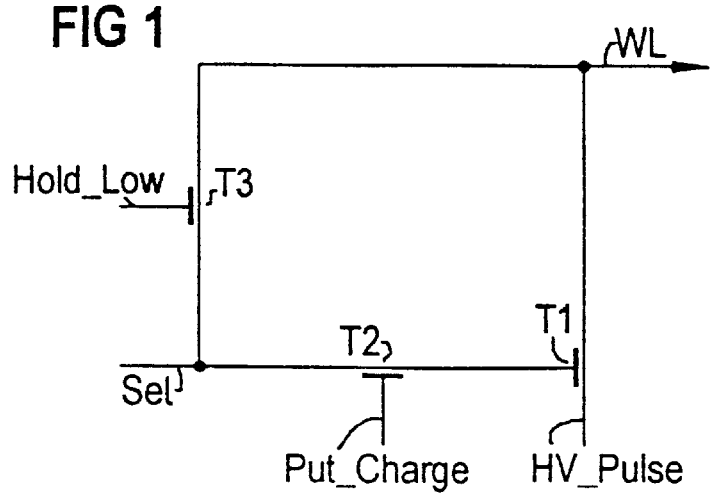
FIG. 1 is a schematic circuit diagram used to explain a drive method according to the invention.

The circuit shown in FIG. 1 uses enhancement type NMOS field-effect transistors T1, T2 and T3.

The transistor T1 has a source section connected to a signal line carrying a signal HV_Pulse, a drain section connected to a signal line carrying a signal WL, and a gate section connected to a drain section of the transistor T2.

The transistor T2 has a source section connected to a signal line carrying a signal Sel, a drain section connected to the gate section of the transistor T1, and a gate section connected to a signal line carrying a signal Put_Charge.

The transistor T3 has a source section connected to the signal line carrying the signal Sel, a drain section connected to the signal line carrying the signal WL, and a gate section connected to a signal line carrying a signal Hold_Low.

A voltage which may assume values between 0 V and +17 V in the illustrative embodiment being described can be applied through the use of the signal HV_Pulse to the source section of the transistor T1.

A voltage which may assume values of 0 V or +5 V in the illustrative example described can be applied through the use of the signal Sel to the source sections of the transistors T2 and T3.

A voltage which may assume values of 0 V or +5 V in the illustrative example described can be applied through the use of the signal Hold_Low to the gate section of the transistor T3.

A voltage which may assume values of 0 V or +5 V in the illustrative example described can be applied through the use of the signal line Put_Charge to the gate section of the transistor T2.

The aim is to pass the maximum source voltage (17 V) of the transistor T1 through the transistor T1 to the signal line WL.

If a conventional method were used for transistor control, a gate voltage of $U_{G1} > 17$ V+$U_T$ would have to be applied to the gate section of the transistor T1 for this purpose.

In contrast, the method according to the invention takes a different path, as will be explained in detail in the following text with reference to FIG. 2.

Figure 2:
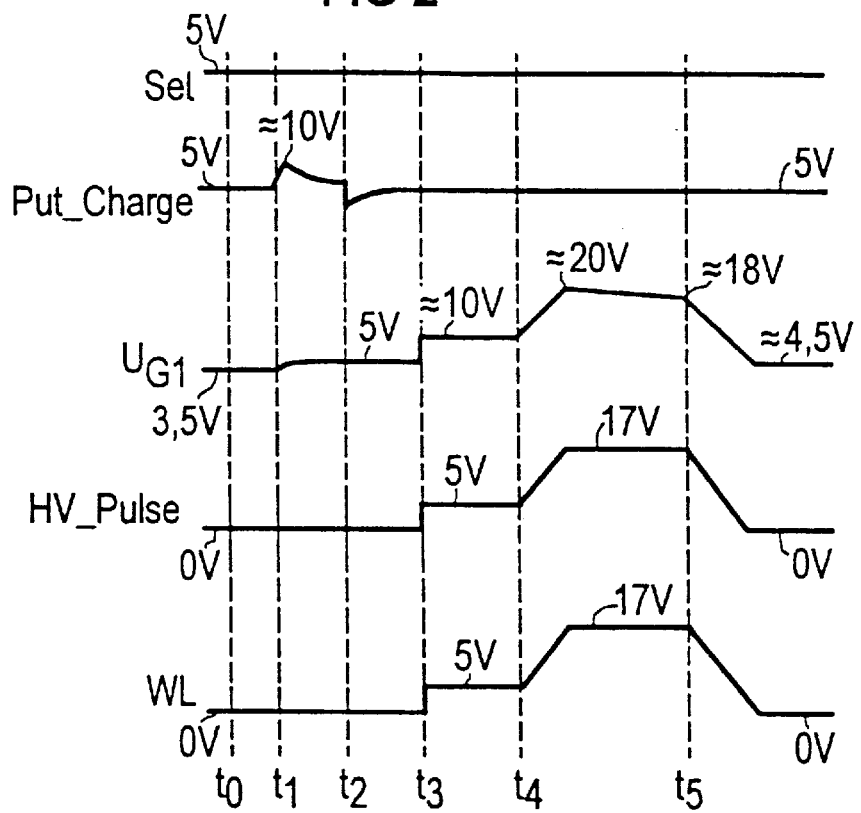
FIG. 2 is a diagram which indicates signal time waveforms at selected points in the circuit according to FIG. 1.

FIG. 2 shows time waveforms of the signals Sel, Put_Charge, HV_Pulse, WL as well as a time waveform of the potential $U_{G1}$ of the gate section of the transistor T1.

It is assumed that the signals Sel and Put_Charge are both at 5 V at a starting time $t_0$.

Since the signal Put_Charge has the same magnitude as the signal Sel and is thus not equal to or greater than Sel+$U_T$, it is not possible for any conductive channel to be formed in the transistor T2 between its source section and its drain section, so that the potential of its drain section and thus the potential $U_{G1}$ of the gate section of the transistor T1 as well are floating (not actively driven) and, at the time being considered, have the magnitude Put_Charge–$U_T$ ($\approx 3.5$ V).

The fact that $U_{G1} = 3.5$ V results in the transistor T1 being in a slightly conductive state.

If, as is shown in FIG. 2, the signal Put_Charge now rises, for example to 10 V at a time $t_1$, then a conductive channel is formed in the transistor T2 and its source voltage (5 V) is passed through (possibly with a certain time delay) to its drain section and to the gate section of the transistor T1.

Since the signal HV_Pulse (the source voltage of the transistor T1) is 0 V at the time $t_1$, the rise in gate voltage $U_{G1}$ of the transistor Ti to +5 V results in a highly conductive channel being formed in the transistor. In consequence, the drain voltage and the signal WL respectively remain at and become 0 V.

If, after completion of the formation of the channel in the transistor T1 or at any time thereafter, the signal Put_Charge falls back or is reduced again to about 5 V or a lower voltage (at a time $t_2$), this leads to the conductive channel in the transistor T2 breaking down. The transistor T2 thus changes to the off stage so that the connection running through the drain section of the transistor T2 is broken between the gate section of the transistor T1 and a supply source which is applying a voltage to that transistor.

The drain section of the transistor T2 and thus the gate section of the transistor T1 as well are thus floating (not actively driven) in this state. These sections thus maintain their previous potential of 5 V unchanged so that the channel formed in the transistor T1 is maintained unchanged.

After achieving this state, the signal HV_Pulse is set from 0 V to 5 V at a time $t_3$ and, because the gate section of the transistor T1 has previously been switched to be floating (and in contrast to the conventional drive method), it is passed through from the source section to the drain section.

Specifically, even before the channel can break down (because the condition $U_{G1} > \min(U_{S1}, U_{D1}) + U_T$ is no longer satisfied), the potential of the gate section of the transistor T1 rises by about 5 V to about 10 V, so that the 5 V applied to the source section can be passed through without the channel breaking down.

The automatic increase in the gate potential at the transistor T1 which has been mentioned can be explained as follows: the gate section and the substrate section which is opposite it and in which the channel is also formed (where it exists) act like plates of a capacitor. The plates were in equilibrium at the time $t_2$ when one of the plates (the gate section) was disconnected from the supply source. It was not possible for any current to flow through the channel at that time, since the source voltage (HV_Pulse) was still 0 V. However, this changed at the time $t_3$, when the source voltage increased to 5 V and was passed through the channel which still existed. As a result of the change in the number of charge carriers on one of the plates (in the channel), passing the 5 V through caused a disturbance in the equilibrium in the capacitor. In order to reproduce the equilibrium, additional charge carriers were drawn to the plate having the fewer charge carriers (gate section) which, in turn, is the factor governing the increase in potential that occurs.

The deliberate use of this effect, which was not known in the past, makes it possible for the transistor to switch on even when the condition $$U_G \geq \min(U_S, U_D) + U_T$$

does not appear to be capable of being satisfied. The outcome of this is that the 5 V which is passed through from the source section of the transistor T1 is applied to the drain section of the transistor T1 (=signal line WL) from the time $t_3$.

The gate voltage $U_{G1}$, which has been raised to about 10 V, thus remains essentially unchanged, at least temporarily.

If, at an (arbitrary) time $t_4$, the source voltage of the transistor T1 (HV_Pulse) is increased in such a way that it rises continuously to the maximum value of 17 V, the gate voltage of the transistor T1 in consequence rises to about 20 V for the reasons explained above, so that the 17 V can also be passed through without any problems to the drain section of the transistor T1 and to the line carrying the signal WL.

The increase in the source voltage of the transistor T1 to the value which is passed through (in this case from 0 V to 17 V) may take place in any desired number of stages. To be precise, it preferably takes place in steps or rises continuously, but it is also possible to take place as a step function.

The passage of the 17 V is ended either by turning off the source voltage (HV_Pulse) or automatically by time elapsing.

The ending of the passage shown in FIG. 2 occurs by time elapsing since charges gradually flow away from the gate section as a result of parasitic leakage paths (undesired capacitances between the gate section and the adjacent electrical, electromechanical or mechanical components, that is a capacitor from the gate section to earth in the equivalent circuit), and the gate potential thus shrinks. As long as the condition $$U_{G1} \geq \min(U_{S1}, U_{D1}) + U_T$$

is satisfied, the line carrying the signal WL can be discharged to 0 V again through the use of the signal HV_Pulse (at a time $t_5$).

If the transistor T3 is driven in a corresponding manner, the signal line WL can be driven in an active manner to any desired voltage values when the transistor T1 is in the off state.

The period during which the high voltage (17 V) can be passed through the transistor T1 depends essentially on the magnitude of the gate potential at the time $t_3$, on how well the gate potential can follow an increase in the number of charge carriers in the channel, and on how quickly the gate section which has been raised to high voltage discharges itself.

If the last-mentioned items are not satisfactory for an intended application in the case of a conventional transistor, then it is possible to consider using a transistor that is optimized for this purpose.

Figure 3:
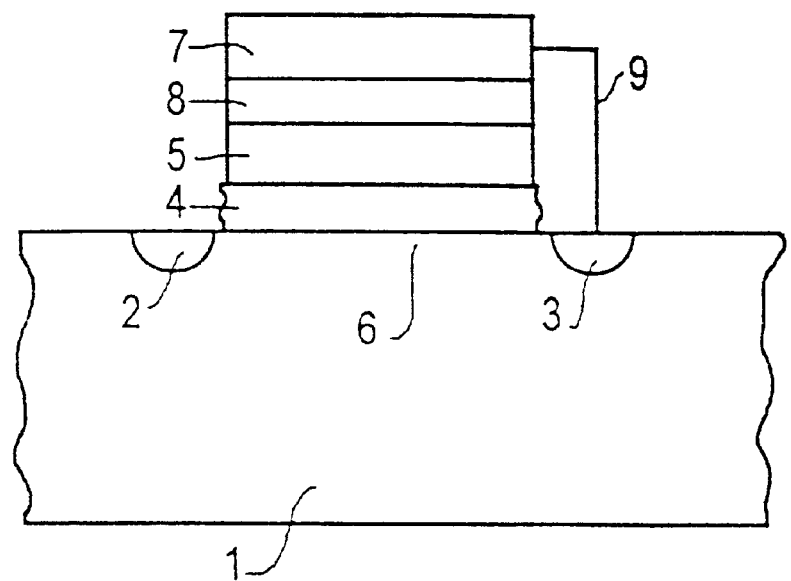
FIG. 3 is a fragmentary, diagrammatic, cross-sectional view of a field-effect transistor which can advantageously be used in the drive method according to the invention.

Such a transistor is illustrated diagrammatically in FIG. 3. The field-effect transistor (enhancement type NMOS-FET) shown in FIG. 3 has a substrate 1, a source section 2, a drain section 3, an insulation layer 4, a gate section 5 and a channel formation region 6.

These elements correspond to the respective elements in the conventional field-effect transistor according to FIG. 4 which has already been described above, and will therefore not be explained again.

In contrast to the field-effect transistor shown in FIG. 4, the field-effect transistor according to FIG. 3 also has a gate cover 7.

According to FIG. 3, the gate cover 7 is provided on the side of the gate section 5 facing away from the substrate 1. The gate cover 7 is composed of electrically conductive material and is electrically connected to the drain section 3 through a connecting lead 9.

A thin insulation layer 8 (the thickness of which is preferably in the nm or $\mu$m range) is provided between the gate section 5 and the gate cover 7, in order to insulate the elements electrically from one another.

The presence of the gate cover 7 means that it is also possible to use the drive method explained in detail above even in those cases in which the desired effect would otherwise not occur to the required extent and/or with the required reliability.

This function of the gate cover is based essentially on the fact that it forms a screen around the gate section which, in contrast to conventional screens, is at the same potential as the drain potential. Thus, on one hand it produces the same positive effect as the channel while, on the other hand it at least limits the flow of charges away from the gate section through parasitic capacitances (undesired capacitances between the gate section and adjacent electrical, electromechanical or mechanical components, that is a capacitor from the gate section to earth is the equivalent circuit) and, in addition, increases the ratio of wanted capacitance (capacitances between the gate section and the substrate as well as between the gate section and the gate cover) to parasitic capacitances.

According to FIG. 3, the gate cover 7 is provided only above the gate section 5 and thus covers the latter entirely or partially only on the side of the gate section facing away from the substrate. However, there is no limitation to this. The gate cover can instead or in addition also cover the side surfaces of the gate section according to FIG. 1. The gate cover has the best effect when all of the regions of the gate section which do not face the substrate (with the interposition of the insulation layer 8 in each case) are surrounded by the gate cover.

According to FIG. 3, the gate cover is electrically connected to the drain section. once again, there is no limitation to this. The gate cover can also achieve an essentially identical effect if the gate cover is electrically connected to the source section instead of to the gate section.

With or without the gate cover, the gate potential of the transistor T1, which has been increased in the described manner, decays gradually again, which in the end leads to the channel breaking down (the field-effect transistor switching off). Depending on the structure of the transistor, the time between the disconnection of the gate section from the supply source and the channel breaking down may be from fractions of seconds to several minutes or even hours. During this time, the transistor can be operated in the steady state.

The automatic breaking down of the channel is one of the additional effects of the drive method according to the invention which can advantageously be used and has already been mentioned initially. It additionally gives the transistor that is driven in this manner the function of a monoflop and thus opens up completely new fields of use for transistors.

Special effects can accordingly also be achieved in this way, since the wanted gate section capacitances (capacitances between the gate section and the substrate as well as, possibly, between the gate section and the gate cover) which have already been referred to above are deliberately changed or are set at specific values (for example by changing the composition and/or the thickness of the respective insulation layers (insulation layers 4 and 8)), in order to make it possible in this way to match the time response of the field-effect transistor to the intended application.

The drive method according to the invention has been described above with reference to an enhancement type NMOS field-effect transistor. However, it is self-evident that such a drive, possibly after suitable adaptation to respective characteristics, can also be implemented and advantageously used in any other types of field-effect transistors.

I claim:

1. In a method for driving a field-effect transistor having a source section, a drain section and a gate section, the improvement which comprises:

applying a gate voltage to the gate section and causing at least one of formation and maintenance of an electrically conductive channel between the source section and the drain section;

after the channel has been formed, disconnecting the gate section from a gate voltage supply source applying the gate voltage to the gate section;

after disconnecting the gate section from the gate voltage supply source, changing a source voltage value applied to the source section; and keeping the gate potential essentially unchanged during the disconnection of the gate section from the gate voltage supply source.

2. The method according to claim 1, which comprises disconnecting the gate section from the gate voltage supply source with a switching device interrupting an electrical connection between the gate section and the gate voltage supply source.

3. The method according to claim 1, which comprises causing the source voltage and a drain voltage to assume values which cause at least one of the formation and maintenance of the electrically conductive channel by interaction with the gate voltage, until the disconnection of the gate section from the gate voltage supply source.

4. The method according to claim 1, which comprises after the disconnection of the gate section from the gate voltage supply source, causing a source voltage to assume values desired to pass through to the drain section.

5. In a method for driving a field-effect transistor having a source section, a drain section and a gate section, the improvement which comprises:

applying a gate voltage to the gate section and causing at least one of formation and maintenance of an electrically conductive channel between the source section and the drain section;

after the channel has been formed, disconnecting the gate section from a gate voltage supply source applying the gate voltage to the gate section;

after disconnecting the gate section from the gate voltage supply source, changing a source voltage value applied to the source section; and placing the gate section in an essentially floating state after the disconnection of the gate section from the gate voltage supply source.

6. The method according to claim 5, which comprises disconnecting the gate section from the gate voltage supply source with a switching device interrupting an electrical connection between the gate section and the gate voltage supply source.

7. The method according to claim 5, which comprises causing the source voltage and a drain voltage to assume values which cause at least one of the formation and maintenance of the electrically conductive channel by interaction with the gate voltage, until the disconnection of the gate section from the gate voltage supply source.

8. The method according to claim 5, which comprises after the disconnection of the gate section from the gate voltage supply source, causing a source voltage to assume values desired to pass through to the drain section.

9. In a method for driving a field-effect transistor having a source section, a drain section and a gate section, the improvement which comprises:

applying a gate voltage to the gate section and causing at least one of formation and maintenance of an electrically conductive channel between the source section and the drain section;

after the channel has been formed, disconnecting the gate section from a gate voltage supply source applying the gate voltage to the gate section;

after disconnecting the gate section from the gate voltage supply source, changing a source voltage value applied to the source section;

after disconnecting the gate section from the gate voltage supply source, causing a source voltage to assume values desired to pass through to the drain section, and also causing the source voltage to simultaneously assume values which would prevent the formation of the channel or would cause it to break down if provided before the disconnection of the gate section from the gate voltage supply source.

10. The method according to claim 9, which comprises increasing the source voltage in steps.

11. The method according to claim 9, which comprises continuously increasing the source voltage.

* * * * *